United States Patent [19]

Morishita et al.

[11] Patent Number: 4,690,066
[45] Date of Patent: Sep. 1, 1987

[54] ELECTROMAGNETICALLY FLOATED CARRIER SYSTEM WITH STOPPING UNIT

[75] Inventors: Mimpei Morishita; Teruo Azukizawa, both of Tokyo, Japan

[73] Assignee: Kabushiki Kaisha Toshiba, Kawasaki, Japan

[21] Appl. No.: 726,982

[22] Filed: Apr. 25, 1985

[30] Foreign Application Priority Data

Jun. 30, 1984 [JP] Japan ................................. 59-135987

[51] Int. Cl.$^4$ ............................................. B61B 13/08
[52] U.S. Cl. ................................... 104/282; 104/284; 104/302; 104/293; 104/295; 188/164; 318/135
[58] Field of Search ................ 104/284, 282, 281, 286, 104/290, 293, 294, 303, 295, 302, 1 R, 307; 33/125 A, 1 L; 188/164, 165; 246/187 B, 182 A, 182 B; 180/167; 198/619, 805, 345; 250/227

[56] References Cited

U.S. PATENT DOCUMENTS

| | | | |
|---|---|---|---|
| 3,233,559 | 2/1966 | Smith et al. ..................... | 104/294 X |
| 3,784,309 | 1/1974 | Brelot et al. .................. | 33/125 A X |
| 3,785,475 | 1/1974 | Maynard ............................ | 198/345 |
| 3,836,799 | 9/1974 | Eastham et al. ................ | 104/282 X |
| 3,849,724 | 11/1974 | Ghibu et al. ..................... | 104/284 X |
| 3,867,886 | 2/1975 | Maki ................................... | 104/282 |
| 3,899,979 | 8/1975 | Godsey, Jr. ..................... | 104/284 X |
| 3,937,148 | 2/1976 | Simpson ........................... | 104/284 X |
| 3,960,090 | 6/1976 | Maki et al. ....................... | 104/281 X |
| 4,055,123 | 10/1977 | Heidelberg ...................... | 104/284 X |
| 4,140,063 | 2/1979 | Nakamura ......................... | 104/284 |
| 4,395,165 | 7/1983 | DeRobertis et al. ............. | 406/88 |

FOREIGN PATENT DOCUMENTS

| | | | |
|---|---|---|---|
| 52-77314 | 6/1977 | Japan ................................. | 104/284 |
| 57-3588 | 9/1982 | Japan ................................. | 318/135 |

*Primary Examiner*—Robert B. Reeves
*Assistant Examiner*—Scott H. Werny
*Attorney, Agent, or Firm*—Oblon, Fisher, Spivak, McClelland, & Maier

[57] ABSTRACT

A carrier which transports semiconductor chips or the like can run along two rails made of a ferromagnetic material and extending along a running path. The carrier has four supports projecting from its bottom. Four magnets units are supported by the supports, respectively, and each magnet unit includes a permanent magnet and a pair of electromagnets such that the magnet units face the rails. The carrier is held floated with respect to the rails by electromagnetic forces acting between the magnet units and rails. The supports support four gap sensors which detect the gap between the magnet units and rails and produce an output signal corresponding to the gap. Magnetic flux control unit is provided on the underside of the carrier to control the current supplied to the electromagnets in accordance with the outputs of the gap sensors to maintain the gap constant within a predetermined range. A stopping unit is provided at a station at which the carrier is to be stopped, and stops the carrier by means of a electromagnetic forces of attraction acting between the stopping unit and one of the magnet units provided on the carrier.

19 Claims, 17 Drawing Figures

F I G. 13
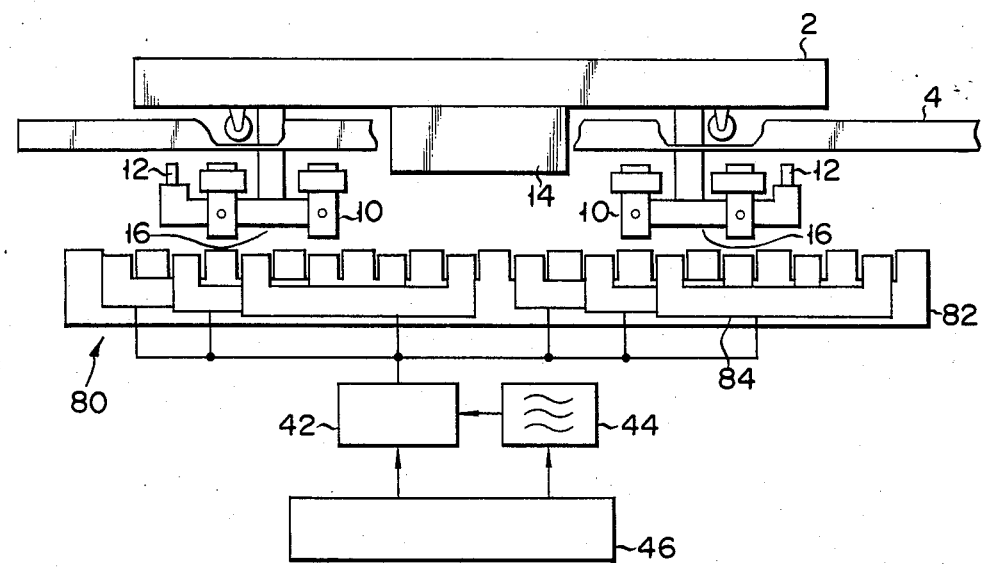
F I G. 14
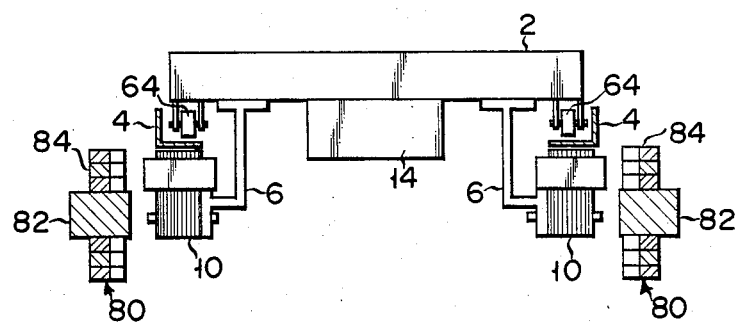

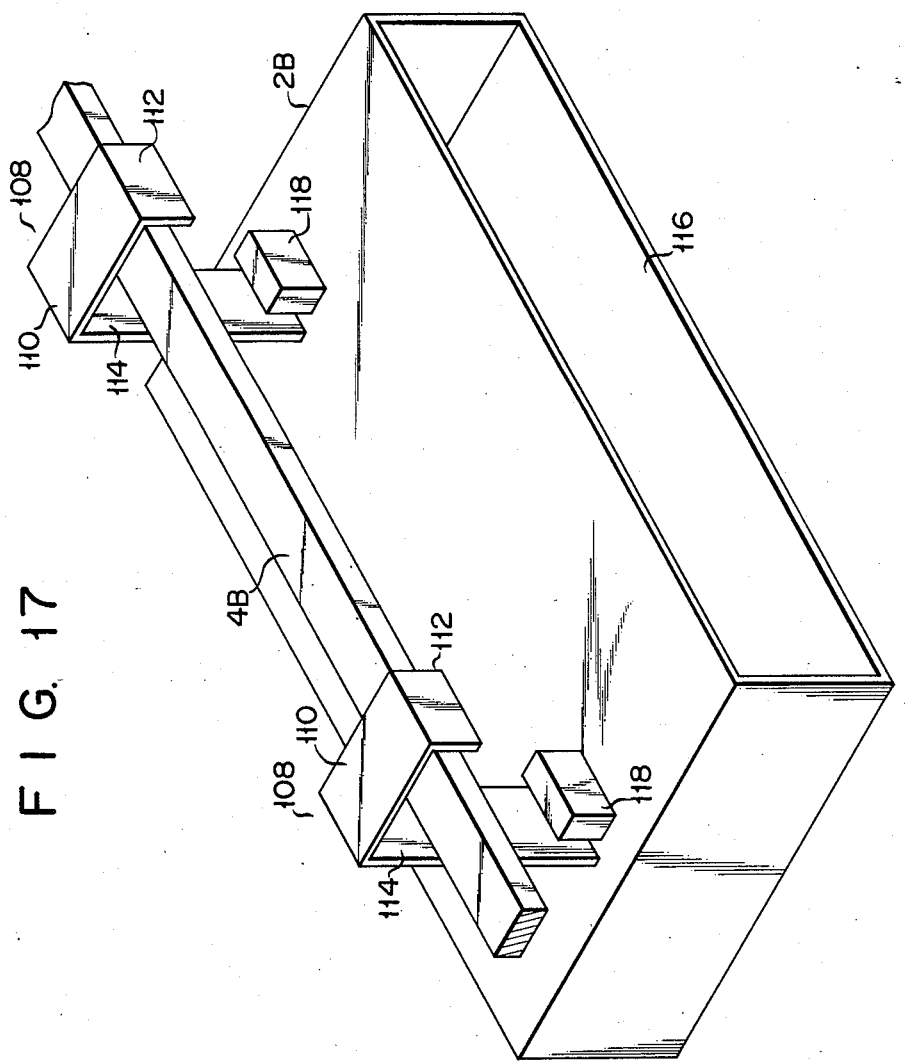

ELECTROMAGNETICALLY FLOATED CARRIER SYSTEM WITH STOPPING UNIT

BACKGROUND OF THE INVENTION

This invention relates to a transporting system of floated carrier type and, more particularly, to a transporting system which includes assemblies for floating and holding a carrier.

Heretofore, there have been known some transporting systems for transporting comparatively light and small articles such as semiconductor chips and documents.

One such transporting system is an airchute system, in which articles such as chips or documents are accommodated in a cylindrical capsule, which is pneumatically transported through a pipe to a predetermined position. In this system, articles must be rolled and put into cylindrical capsules. Therefore, punched cards, mark sheets, etc., cannot be transported by this system for they cannot be rolled. In addition, while the capsules are being transported by the airchute system, mechanical shock and noise will be made in the pipe.

Another well-known transporting system is a belt conveyor system. This system, however, has a low conveying speed and produces noise. Moreover, it requires a large space.

SUMMARY OF THE INVENTION

An object of the invention is to provide a transporting system of floated carrier type, which can reduce power consumed to float a carrier, does not produce much noise and has a simple structure.

The transporting system of floated carrier type according to the invention has at least one rail along which the carrier with cargo runs. At least the bottom portion of the rail is made of a ferromagnetic material. Magnet units are attached to the carrier to float the carrier with respect to the rail. These units face the rail, and each includes at least one permanent magnet and at least one electromagnet. The carrier also has gap sensor means for sensing the gap between the magnet units and the rail. The electromagnets are energized according to the output of the gap sensor means, and the carrier is held floated with respect to the rail by the magnetic attraction of the magnet units.

BRIEF DESCRIPTION OF THE DRAWINGS

FIG. 13 is a side view of the transporting system shown in FIG. 11;

FIG. 14 is a sectional view showing another modification of the carrier propelling mechanism;

FIG. 17 is a perspective view showing another modification of the transporting system employing the floating assemblies shown in FIG. 5.

DETAILED DESCRIPTION OF THE PREFERRED EMBODIMENTS

Now, an embodiment of the transporting system according to the invention will be described with reference to FIGS. 1 to 7.

Figure 1:
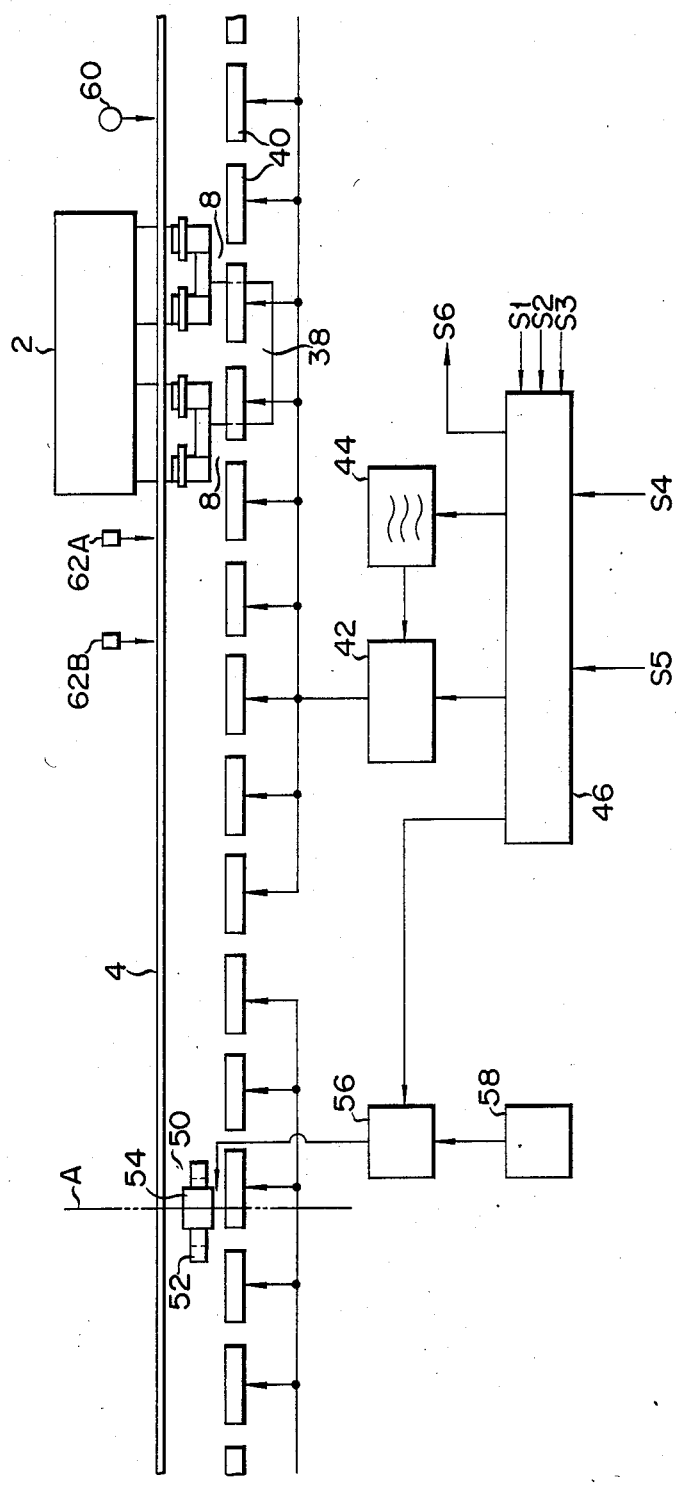
FIG. 1 is a schematic representation of a transporting system of floated carrier type according to the invention.
Figure 2:
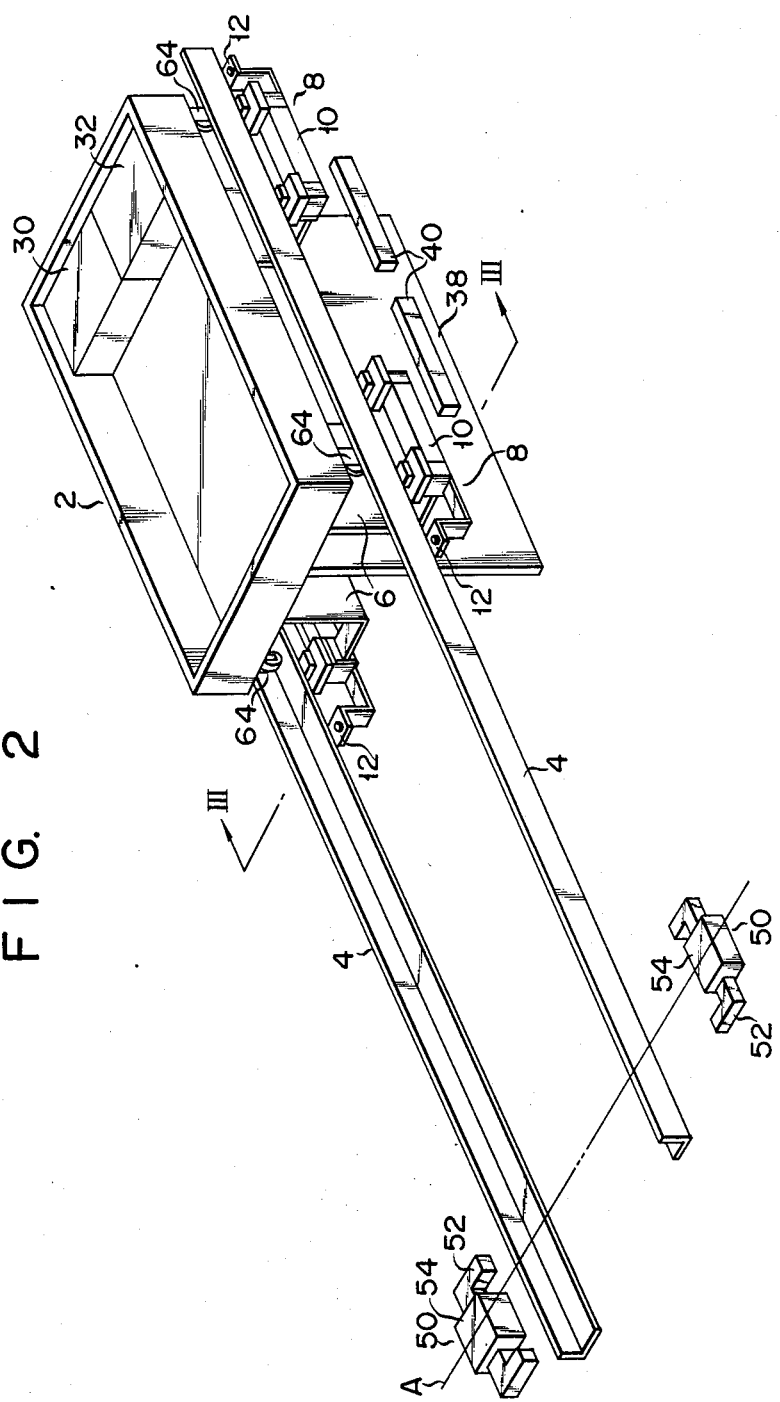
FIG. 2 is a perspective view showing the transporting system shown in FIG. 1.
Figure 3:
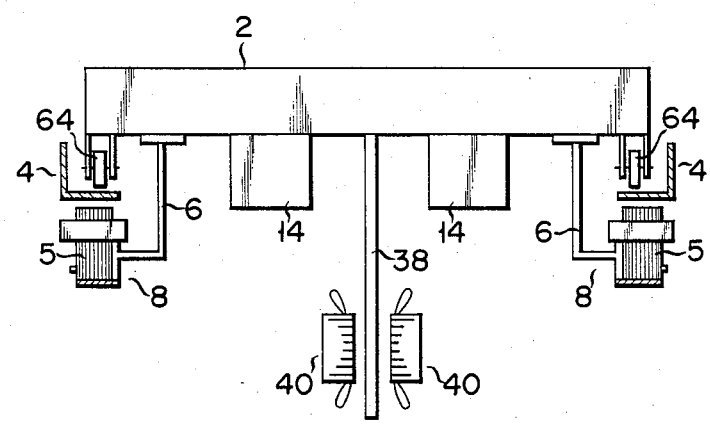
FIG. 3 is a sectional view taken along line III—III in FIG. 2.

FIG. 1 schematically shows the transporting system. As shown in this figure, a box-like carrier 2 which carries cargo, e.g., semiconductor chips, runs along two L-shaped rails 4. At least the bottom sections of the rails 4 are made of ferro-magnetic material. The carrier 2, as shown in FIGS. 2 and 3, has four supports 6, each downwardly extending from the bottom of the carrier 2 and bent beneath the associated rail 4. Each support 6 supports one floating assembly 8.

Figure 4:
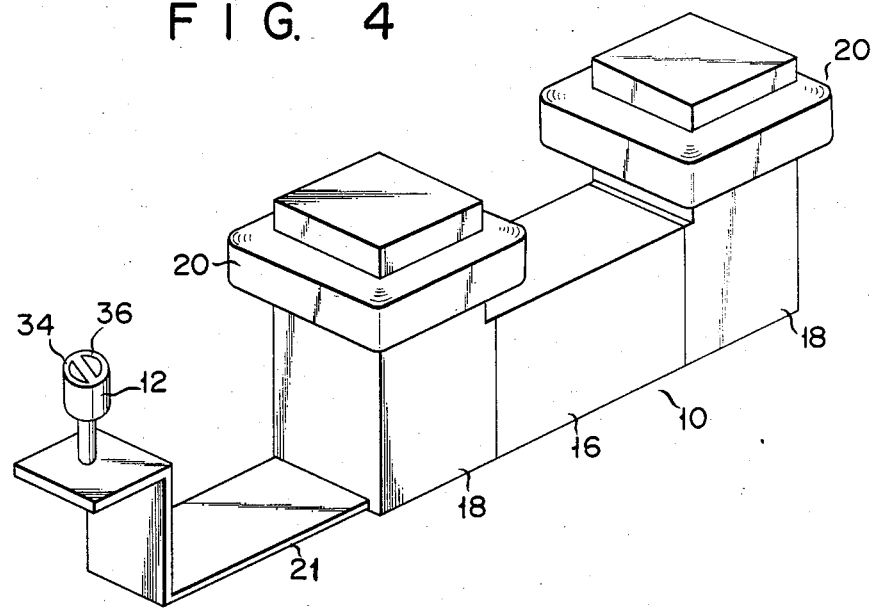
FIG. 4 is an enlarged perspective view showing a floating assembly shown in FIG. 2.
Figure 5:
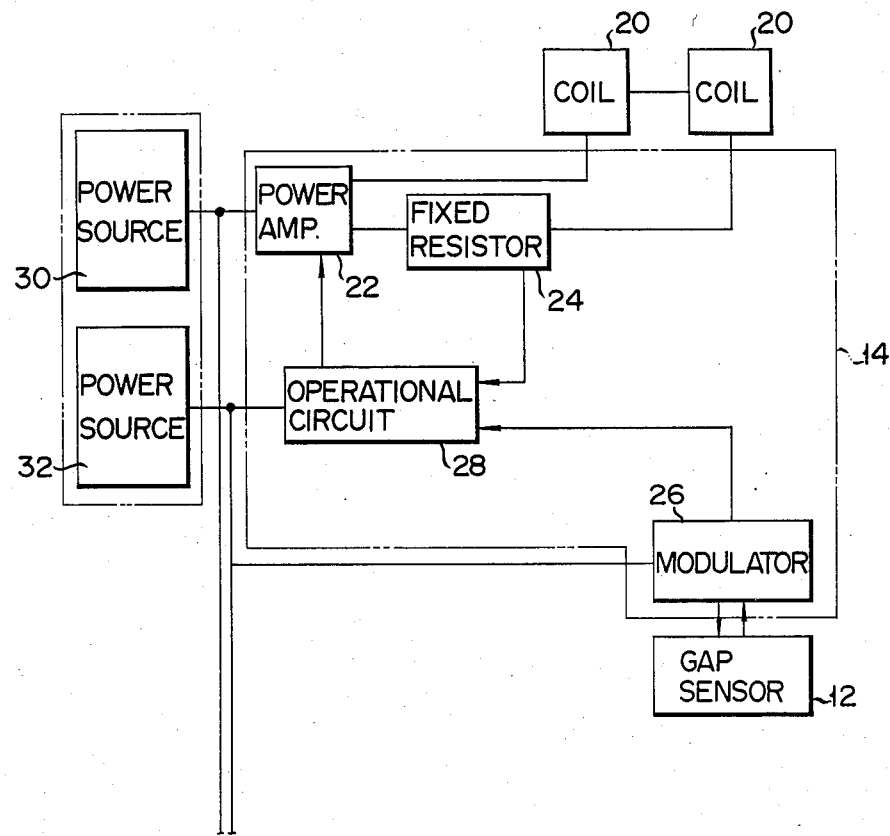
FIG. 5 is a block diagram showing a circuit for supplying current to the coils of the floating assembly.

Each floating assembly 8 includes a magnet unit 10 which generates a force to attract the magnet unit 10 to the rail 4. The assembly 8 also includes a gap sensor 12 which senses the gap between the magnet unit 10 and rail 4. The carrier 2 has four magnetic flux control units 14 secured to its bottom. Each magnetic flux control units 14 controls the intensity of the magnetic field produced by the corresponding magnet unit 10. As shown in FIG. 4, each magnet unit 10 includes a permanent magnet 16, yokes 18 of ferromagnetic material coupled to the front and rear ends of the permanent magnet 16, and coils 20 wound around the yokes 18. The magnet unit 10 is supported by the associated support 6, with the top of the yokes 18 facing the bottom of the rail 4. The coils of the magnet units 10 are electrically connected to the magnetic flux control units 14. Hence, the magnetic flux of the units 10 is controlled by the magnetic flux of the coils 20. The gap sensor 12 is a photo-coupler sensor which includes a light-emitting element 34 for emitting a light beam toward the rail 4 and a light-receiving element 36 for detecting a light beam reflected from the rail 4. The gap sensor 12 is supported by support member 21 made of a non-magnetic material and projecting along the rail 4 from a lower portion of the magnet unit 10 such that its top, i.e., the light emitting surface of the light-emitting element 34 and light receiving surface of the light-receiving element 36, faces the bottom of the rail 4. In the magnetic flux control unit 14 shown in FIG. 5, a power amplifier 22 is connected to the coils 20 through a fixed resistor 24 for supplying current to the coils 20. The gap sensor 12 is connected to a modulator 26. The modulator 26 generates a reference modulation signal and supplies the signal to the gap sensor 12. It also removes noise due to an external light component from an output signal of the gap sensor 12. The modulator 26, fixed resistor 24 and power amplifier 22 are connected to an operational circuit 28, which performs an arithmetic operation of the voltage supplied through the fixed resistor 24 and the output of the modulator 26 to determine the amplification factor of the power amplifier 22. The power amplifiers 22, operational circuit 28 and modulator 26 are connected to corresponding power sources 30 and 32.

In the floating assemblies 8, the magnet units 10 are held in contact with the rails 4 by the attractive force of the permanent magnets 16 so that the carrier 2 is secured to the rails 4, unless a current is supplied to the coils 20 from the power sources 30 and 32 provided in the carrier 2. When a switch (not shown) is closed, a current is supplied from the power source 30 to the coils 20, while a current is also supplied from the power source 32 to the gap sensors 12. The coils 20 generate magnetic fluxes in the opposite direction to the magnetic fluxes generated by the permanent magnets 16. As a result, the force of the magnet units 10 is reduced, and the units 10 are moved from the rail 4, whereby the supports 6 float. In other words, the carrier 2 is floated with respect to the rails 4. The magnetic flux control unit 14 controls the magnetic flux of the coils 20 to hold the carrier 2 floated with respect to the rails 4, with the gap between magnet units 10 and rails 4 maintained within a predetermined range. The light-emitting element 34 of the gap sensor 12 generates a modulated light beam according to the reference signal supplied from the modulator 26 shown in FIG. 4. The modulated light beam is reflected by the rail 4, and the light-receiving element 36 receives the reflected light beam. At this time the gap sensor 12 generates an output corresponding to the intensity of the incident light beam. This output is supplied to the modulator 26. The modulator 26 removes noise from the output, and its output free from noise is fed to the operational circuit 28. The intensity of the light beam detected by the light-receiving element 36 varies in inverse proportion to the square of the distance between the magnet unit 10 and rail 4. This means that the output supplied from the gap sensor 12 to the operational circuit 28 depends upon the gap between the magnet unit 10 and rail 4. If the detected gap is greater than the predetermined range, a control signal is supplied from the operational circuit 28 to the power amplifier 22 to increase the current supplied to the coils 20 as to increase the force of the magnet units 10. Accordingly the amplification factor of the power amplifier 22 is increased positively and then the positive current supplied to the coils 20, that is, one generating magnetic flux in the direction of the magnetic flux generated by the permanent magnets 16 is increased, thereby gaining the attracting force of the magnet units 10. If the detected gap is less than the predetermined range, a control signal for increasing the negative current supplied to the coils 20, that is, one generating magnetic flux in the opposite direction of the magnetic flux generated by the permanent magnets 16 is supplied from the operational circuit 28 to the power amplifier 22 to increase the negative amplification factor thereof. Accordingly the negative current supplied to the coils 20 is increased, and the attracting force of the magnet units 10 is decreased. The current supplied to the coils 20 is converted by the fixed resistor 24 into a corresponding voltage signal, which is fed as feedback signal to the operational circuit 28. Thus, a current corresponding to the gap between the magnet unit 10 and rail 4 is supplied to the coils 20. The magnetic flux of the magnet unit 10 is controlled so that the carrier 2 can be desirably floated. Since the attracting force of the magnet unit 10 is controlled by the current supplied to the coils 20, the gap between the magnet unit 10 and rail 4 is held within the predetermined range, irrespective of the weight of the cargo carried by the carrier 2 and other conditions.

The gap sensor 12 may be replaced with a magnetic sensor, e.g., a Model KD-2300-6C manufactured by Kaman Instrumentation Corporation. This magnetic sensor detects a magnetic field due to eddy current generated in the rail 4 and varying as a function of the distance between the magnetic unit 10 and rail 4. The changes of this magnetic field, i.e., changes in the impedance, may be utilized to control the current supplied to the coils 20. Ultraviolet rays and ultrared rays may be utilized as the light beam instead of visible rays. The power source 30 supplies comparative high power to the power amplifier 22, while the power source 32 supplies comparatively low power to the gap sensor 12, etc. The power sources 30 and 32 supply power to all the four floating assemblies 8.

A mechanism for propelling the carrier 2 will now be described. In the transporting system shown in FIGS. 1 and 3, a linear induction motor is employed to drive the carrier 2. More specifically, a conductor plate 38 of aluminum, copper, etc., extends downwardly from the center of the bottom of the carrier 2. Pairs of stator units 40 are arranged in a row such that the conductor plate 38 can pass through between the stator units 40 of each pair. Each stator unit 40 includes a core and three-phase coils wound thereon. The three-phase coils are connected to a three-phase AC power source 44 via a switch 42. The switch 42 and a power switch of the AC power source 44 are connected to and operated by a signal generator 46.

When the switch 42 and power switch of the three-phase AC power source 44 are closed, the AC power source 44 applies three-phase AC current to the three-phase coils of the stator units 40. Thus, a shifting, alternating three-phase magnetic field is generated on the conductor plate 38, induction current is generated in the plate 38 by the shifting, alternating magnetic field. The driving force applied to the conductive plate 38 acts in the shifting direction of the alternating magnetic field, due to the interaction between the magnetic field generated by the induced current and the magnetic field generated by the stator units 40. As a result, the carrier 2 is moved. In the illustrated embodiment, pairs of stator units 40 are provided along the running path of the carrier 2. However, since the resistance against the running of the carrier 2 is sufficiently low so long as the carrier 2 is floated, it is not necessary to use a plurality of pairs of stator units 40 for providing sufficient propelling force to the carrier 2. For example, necessary numbers of pairs of stator units 40 may be provided at stations and curved sections of the running path.

Now, a mechanism for forcibly stopping the carrier 2 at a station will be described.

As shown in FIGS. 1 and 2, two stopping units 50 are provided at a station A. They face each other on the outer sides of the rails 4. Each stopping unit 50 includes a yoke 52 of a ferromagnetic material and a coil 54 wound thereon. As shown in FIG. 1, the coils 54, are connected to a DC power supply 58 via a switch 56. The yoke 52 of each stopping unit 50 faces the outer side surface of the yoke 18 of the associated front magnet unit 10 of the carrier 2 in the running direction thereof when the carrier 2 is stopped. More specifically, when the associated front magnet unit 10 is stopped at the station A, the end of the yoke 52 faces the outer side of the magnet unit 10 via a predetermined gap G between the magnet unit 10 and yoke 52.

To stop the carrier 2, the control unit 46 transmits a stopping signal to the switch 56, thus turning on the switch 56. At this time, current is supplied from the DC power source 56 to the coils 54. The carrier 2 is stopped by the magnetic forces produced by the magnetic flux generated by the coils 54 and leakage flux of the magnet units 10 of the carrier 2 being decelerated. The carrier 2 can be stopped at desired positions by providing the stopping units 50 at corresponding positions along the rails 4.

A first detector 60 for detecting the passage of a carrier 2 is provided adjacent to the running path between the station A and another station (not shown). Further, second and third detectors 62A and 62B for detecting the passage of the carrier 2 are provided between the detector 60 and station A. As described hereafter, the output signal S3, S1 and S2 of the respective detectors 60, 62A and 62B are fed to the signal generator 46.

It is now assumed that the carrier 2 is stationary at a station (not shown) outside the right side of FIG. 1. To start the carrier 2 in this state from the station noted above to the station A, a starting signal S4 is fed from, for instance, a keyboard (not shown) to the signal generator 46. In response to this starting signal S4, the signal generator 46 produces an energizing signal for closing the switch 42 and power switch of the three-phase AC power source 44. The stator units 40 thus produces a propelling force, and the carrier 2 is moved toward the station A. While running, the carrier 2 is floated with respect to the rails 4.

When the carrier 2 passes by the area adjacent to the first detector 60 after a stopping signal S5 has been given from the keyboard to the signal generator 46, the first detector 60 produces an output signal. In response to this signal, the signal generator 46 feeds a reverse mode signal to the three-phase AC power source 44. The three-phase AC power source 44 is thus switched from the forward mode to the reverse mode. As a result, a reverse mode shifting, alternating magnetic field is generated, which acts on the carrier 2 in the opposite direction to the running direction. The carrier 2 is thus given an electromagnetic force serving as a braking force, and is decelerated. When the carrier 2 being decelerated passes through the area adjacent to the detectors 62A and 62B, the signal generator 46 calculates the speed of the carrier 2, according to the signals S1 and S2 therefrom. When a predetermined period of time which is based on the calculated speeds has passed, the signal generator 46 produces an signal, thus turning off the switch 42 so as to release the braking force given to the carrier 2, and at the same time, closing the switch 56 to energize the coils 54 of the stopping units 50. After releasing the braking force applied to it, the carrier 2 runs due to the force of inertia and is sufficiently decelerated. The carrier 2 thus runs toward the station A at decreasing speed.

Figure 6:
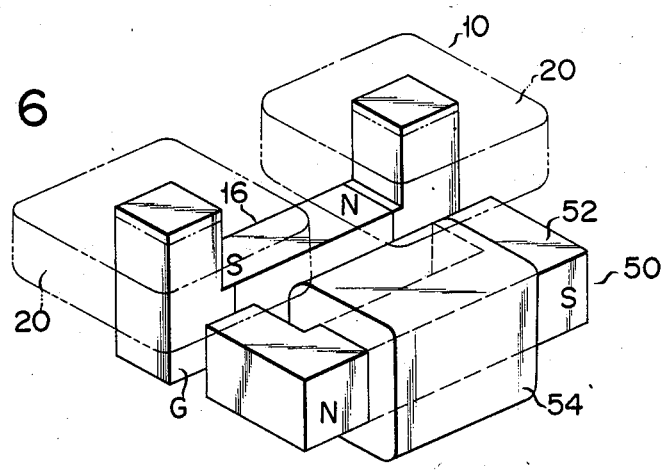
FIG. 6 is an enlarged perspective view illustrating the positional relation between a unit for stopping a carrier and a magnet unit of the floating assembly.
Figure 7:
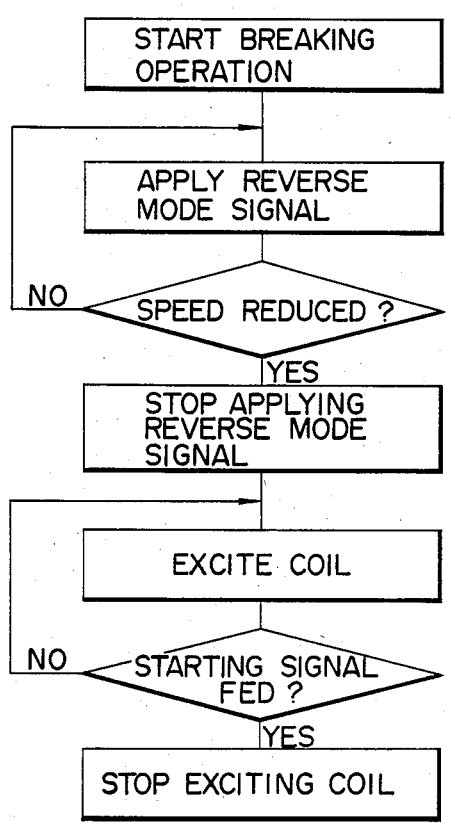
FIG. 7 is a flow chart illustrating how the transporting system operates until the carrier is stopped.

When the front magnet units 10 in the running direction of the carrier 2 eventually reach the station A, the outer side of each of them comes to face the ends of the associated yoke 52 as shown in FIG. 6. Suitable electromagnetic forces of attraction are thus generated between each magnet unit 10 and the associated yoke 52. Hence, the carrier 2 is stopped. The flow chart of FIG. 7 illustrates how the carrier 2 is stopped. When the carrier 2 is stopped at the station A and the switches of the power sources 30 and 32 for supplying current to the coils 20 are opened, the magnet units 10 are attracted to the rails 4, so that the carrier 2 is secured to the rails 4. When the cargo on the carrier 2 is heavy or when a downward force is applied to the carrier 2, it is likely that the magnet units 10 are not attracted to the rails 4 so that the carrier 2 falls. In such a case, four wheels 64 which are provided on the underside of the carrier 2 rest on the rails 4 to protect the carrier 2 and cargo.

In the transporting system according to the invention, the carrier 2 and cargo are supported mainly by the magnetic forces of attraction generated between the permanent magnets 16 and rails 4. Therefore, the current supplied to the coils 20 of the magnet units 10 may be far lower than the case of the floating assemblies in the prior art transporting system. Obviously the power sources 30 and 32 may be small enough to be loaded on the carrier 2. In this case, since the floating assembly 8 need not be supplied with current from the outside of the carrier 2, the transporting system according to the inventon can be simpler than the prior art transporting system of the same type. Further, the mechanism for stopping the carrier 2 does not stop the carrier 2 mechanically but stops the carrier 2 with electromagnetic forces. The carrier 2 thus can be stopped accurately. It is also stopped without any shock given to it. Thus, the cargo will never be flung out of the carrier 2 when the carrier 2 is stopped. Further, since the mechanism effectively utilizes the leakage flux of the permanent magnets 16, the stopping units 50 may be extremely simplified. Since the stopping units 50 have the coils 54 wound on the yokes 52, the electromagnetic forces for stopping the carrier 2 can be adjusted by controlling the current supplied to the coils 54. The gap G shown in FIG. 6 may be relatively large since the sufficient stopping force can be obtained, even when the coils 54 are not energized, electromagnetic force of attraction is produced between the yokes 52 of the stopping units 50 and the permanent magnets 16 of the magnet units 10. Due to these forces, the carrier 2 receives forces to stop it, at all times. Where the gap G is large, the forces are low. Therefore, the force required to start the carrier 2 may be sufficiently low. This means that low current is required to be supplied to the stator units 40.

The embodiment described above is by no means limitative, and various changes and modifications are possible.

Figure 8:
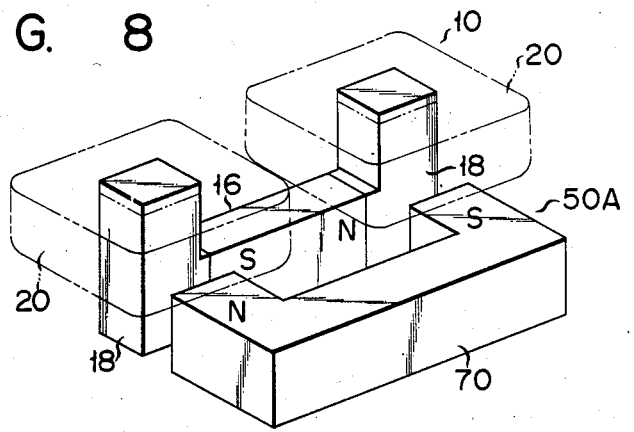
FIG. 8 is a perspective view showing a first modification of the stopping unit shown in FIG. 6.
Figure 9:
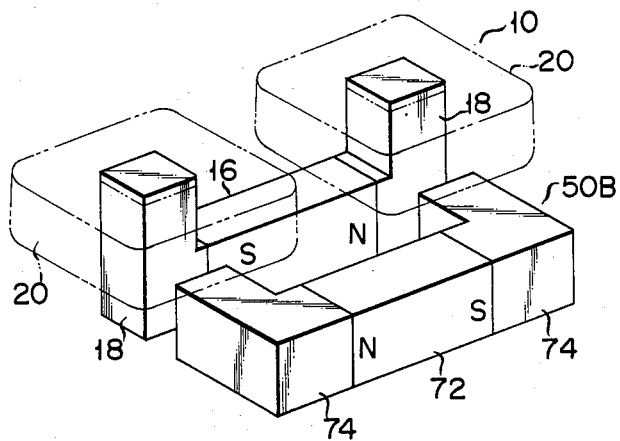
FIG. 9 is a perspective view showing a second modification of the stopping unit shown in FIG. 6.
Figure 10:
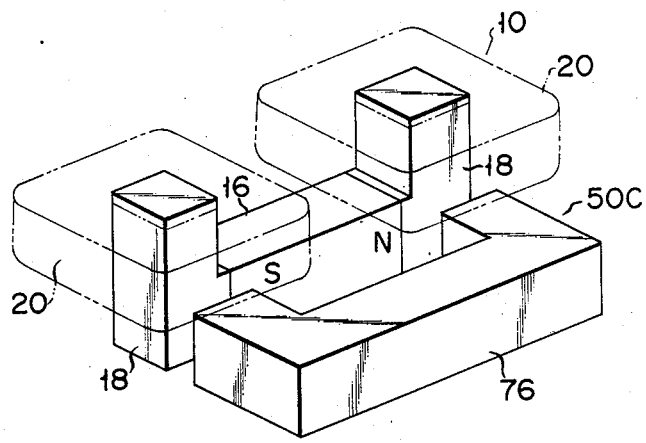
FIG. 10 is a perspective view showing a third modification of the stopping unit shown in FIG. 6.

FIGS. 8 to 10 show modifications of the stopping unit 50. In the stopping unit 50A shown in FIG. 8, only one permanent magnet 70 is used instead the yoke 52 and coil 54 shown in FIG. 6. The stopping unit 50B shown in FIG. 9 is composed of a permanent magnet 72 and ferromagnetic yokes 74 provided on the opposite ends of the permanent magnet 72. The stopping unit 50C shown in FIG. 10 is composed of one ferromagnetic yoke 76. These stopping units 50A, 50B and 50C permit dispensing with the switch 56 and DC power supply 58 shown in FIG. 1. The stopping units are located sidewise of the rails, but they may be arranged beneath the rails. Further, in the above embodiment the three-phase AC power source is switched from the forward mode over to the reverse mode when stopping the carrier 2. Instead, an eddy current providing a braking force may be generated from a DC current supplied to the stator units 40. Where the stopping units 50A, 50B or 50C are employed, a driving unit may be provided, which brings the stopping units close to the rails 4 only when stopping the carrier 2.

Figure 11:
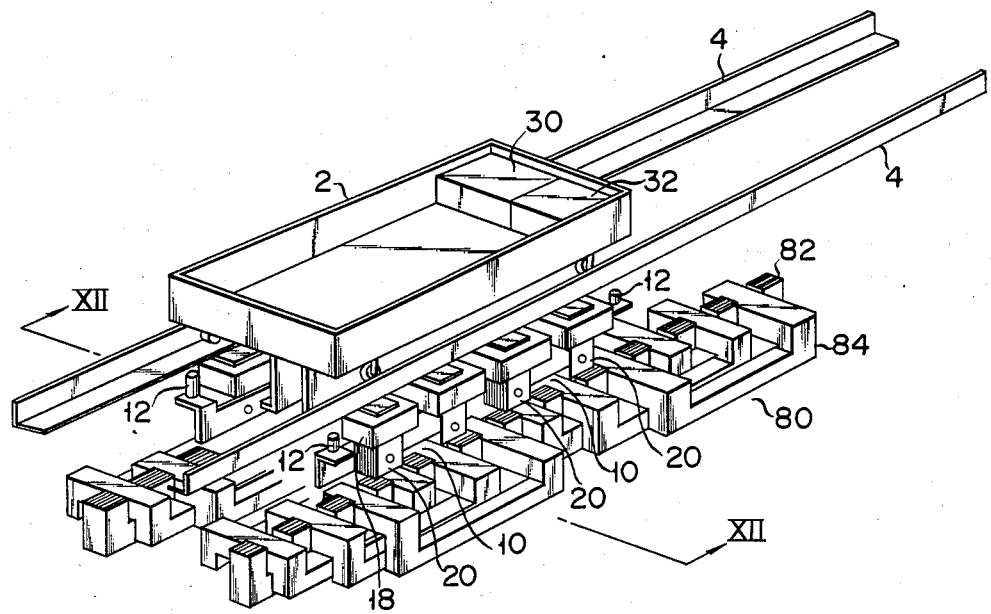
FIG. 11 is a perspective view showing a modification of a carrier propelling mechanism used in the transporting system.
Figure 12:
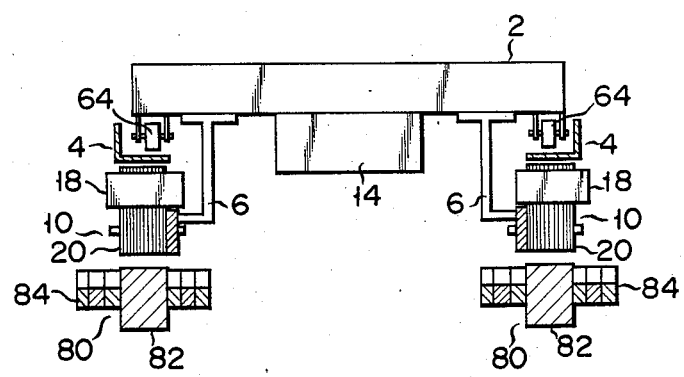
FIG. 12 is a sectional view taken along line XII—XII in FIG. 11.

FIGS. 11 to 13 show a modification of the mechanism for propelling the carrier 2. In these Figures, parts like those in FIGS. 1 to 10 are designated by the same reference numerals. As shown in FIGS. 11 and 12, two rows of stator units 20 are provided along the rails 4 and face the underside of the magnet units 10. Each of the stator units 80 includes a yoke 82 made of a non-magnetic or magnetic material and a coil 84 wound on the yoke 82. The coils 84 are connected to a three-phase AC power source 44 via a switch 42 as shown in FIG. 13. The switch 42 and three-phase AC power source 44 are connected to a signal generator 46. The generator 46 controls the AC power source 44 to move the carrier 2. The stator units 80, magnet units 10, switch 42 and AC power source 44 constitute a propelling mechanism with linear synchronous motor. When the switch 42 is closed by a starting signal from the signal generator 46, a shifting, alternating magnetic field is generated on the yokes 82. The carrier 2 is given a predetermined propelling power by the electromagnetic forces of attraction and repulsion between the shifting, alternating magnetic field and leakage flux of the magnet units 10. The propelling mechanism shown in FIGS. 11 to 13 makes use of the leakage flux of the permanent magnets 16 of the magnet units 10, and no conductor plate 38 has to be provided on the bottom of the carrier 2. To stop the carrier 2, the magnetic field generated by the stator units 80 is made constant. As a result, the carrier 2 is stopped by this magnetic field and the magnetic forces of attraction produced by the magnetic units 10. Hence, there is no need of providing stopping units 50 described above. Thus, it is possible to reduce the production cost of the transporting system.

FIG. 14 shows another modification of the mechanism for propelling the carrier 2. In this instance, stator units 80 which are the same as those shown in FIG. 12 are disposed on the outer sides of the rails 4, and the leakage flux from the side of the permanent magnets 16 and shifting, alternating magnetic field from the stator units 80 are utilized to propel the carrier 2. Where the stator units 80 are arranged beneath the rails 4, electromagnetic forces of attraction, which act in vertical direction, are produced between the magnet units 10 and stator units 80. Therefore, the magnetic force of the magnet unit 10 must be great enough to cause the carrier 2 to float. Where the stator units 80 are disposed on the outer sides of the rails 4, electromagnetic forces are produced in horizontal directions between the magnet units 10 and stator units 80 and cancel one another. Therefore, the magnet units 10 need not generate a great magnetic field to cause the carrier 2 to float, and the permanent magnets 16 may be small.

In the embodiment shown in FIG. 14, the stator units 80 have been disposed on the outer sides of the rails 4, it is possible to dispose stator units 80 on the inner sides of the rails 4. Further, the linear synchronous motor as shown in FIG. 14 may be replaced with a linear DC motor or a linear pulse motor which makes use of the leakage flux of the magnet units 10 for providing a propelling power to the carrier 2. Moreover, the coils 84 need not be wound on the yokes 82; for instance, they may be buried in moldings or secured by means of bands.

Figure 15:
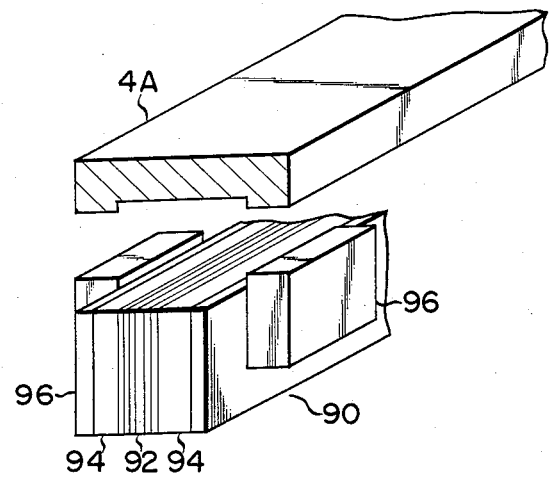
FIG. 15 is a perspective view showing a modification of the floating assembly.
Figure 16:
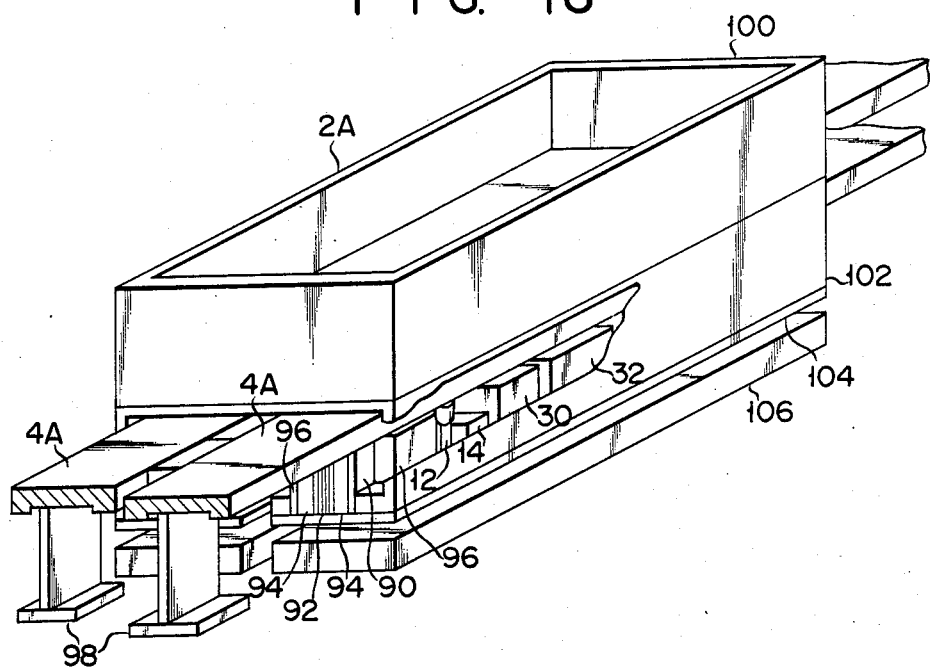
FIG. 16 is a perspective view showing a modification of the transporting system employing the floating assemblies shown in FIG. 15.

FIG. 15 shows a modification of the floating assembly 8, and FIGS. 16 and 17 show modifications of the transporting system of carrier float type utilizing the floating assembly shown in FIG. 15. Referring to FIG. 15, a floating assembly 90, which is provided on a carrier 2A as shown in FIG. 16 or 17, is arranged beneath a rail 4A made of a ferromagnetic material. In the illustrated floating assembly 90, a coil 92 is wound on a yoke (not shown), and two permanent magnets 94 are provided on the sides of the coil 92. Two yoke members 96 are provided on the two outer sides of each permanent magnet 94. The coil 92, permanent magnets 94 and yoke members 96 constitute a sandwich type floating assembly 90. This floating assembly 90 causes the floating of the carrier 2A under the same principle at the floating assembly 8 described before.

In FIGS. 16 and 17, parts like those in FIGS. 1 to 15 are designated by the same reference numerals, these parts are not described here. In the transporting system shown in FIG. 16, the carrier 2A surrounds the rails 4A which are supported by support members 98. The carrier 2A is open at its top 100, in which cargo such as semiconductor chips may be loaded.

The carrier 2A has a lower case 102 which accommodates power sources 30 and 32. Each of the four corners of the lower case 102 has one floating assembly 90, one gap sensor 12 and one magnetic flux control unit 14. Conductor plates 104 of aluminum or the like are provided on the underside of the lower case 102 and stator units 106 are provided beneath the lower case 102 along the rails 4A. The conductor plates 104 and stator units 106 constitute a single-side type linear induction motor, which gives the carrier 2A propelling power under the principle as described before.

In the transporting system shown in FIG. 17, two supports 108 which support the carrier 2 are arranged to be floated with respect to a rail 4B. More specifically, each support 108 has a horizontal portion 110 facing the top of the rail 4B, a vertical portion 112 extending from one end of the horizontal portion 110 and another vertical portion 114 extending from the other end of the horizontal portion 110 to a greater extent than the vertical portion 112. The vertical portion 114 is secured to the top of the carrier 2B. In this system, the carrier 2B is disposed beneath the rail 4B. This carrier 2B has an open side 116, in which cargo may be loaded. Gap sensors 118, floating assemblies (not shown) and magnetic flux control units (not shown) are provided on top of the carrier 2B, and a propelling mechanism (not shown) for propelling the carrier 2B is provided under the carrier 2.

The yoke members 96 employed in the transporting system of FIG. 16 may be replaced with other materials or have different shapes, or they may be omitted.

In all the transporting systems described above, it is possible to provide any desired number of carriers, and a plurality of carriers which are coupled together may be employed.

What is claimed is:

1. A system for transporting cargo to a predetermined position, comprising:
   a carrier for carrying cargo;
   at least one rail extending along the travelling path of said carrier, at least the lower portion of said rail being made of a ferromagnetic material;

means including a plurality of magnet units each having at least one permanent magnet and at least one electromagnet, provided on said carrier and facing said rail, for generating electromagnetic force that floats said carrier with respect to said rail, a gap being provided between each magnet unit and said rail;

gap sensor means provided on said carrier for sensing the gap between each magnet unit and said rail and generating an output signal representing this gap;

means for energizing said electromagnets with an excitation current in accordance with the output signal of said gap sensor means to make the gap fall within a predetermined range;

means provided on said carrier for supplying power to said gap sensor means and said energizing means; and a station, at which said carrier is to be stopped, and at least a stopping unit provided at said station such that it faces one of said magnet units when said carrier is stopped at said station, said carrier being stopped upon arrival at said station by electromagnetic forces of attraction acting between said stopping unit and magnet unit.

2. The system according to claim 1, wherein said carrier is located above said rail, and said magnet units are arranged with their upper sides facing the lower side of said rail.

3. The system according to claim 1, wherein said carrier is located below said rail, and said magnet units are arranged with their upper sides facing the lower side of said rail.

4. The system according to claim 1, which further comprises means for detecting the excitation current supplied to said electromagnet and generating an output responding to the excitation current.

5. The system according to claim 1, wherein said gap sensor means includes a light-emitting element for emitting a light beam toward said rail and a light-receiving element for detecting the intensity of the light beam reflected by said rail.

6. The system according to claim 1, which further comprises support means provided on each of said magnet units, made of a non-magnetic material and supporting said gap sensor means, said gap sensor means being secured to said support means such as to face said rail.

7. The system according to claim 1, wherein said power supplying means includes two power sources for supplying power to said gap sensor means and said energizing means, respectively.

8. The system according to claim 1, which further comprises carrier propelling means including a conductor plate provided on said carrier and a plurality of stator units disposed along said rail such as to give a shifting, alternating magnetic field to said conductor plate, said carrier being given a propelling power by electromagnetic force acting between a magnetic flux generated by said stator units and a magnetic flux set up by current induced in said conductor plate by said shifting magnetic field.

9. The system according to claim 8, wherein said conductor plate extends from the bottom of said carrier and said plurality of stator units face said conductor plate.

10. The system according to claim 8, wherein said conductor plate is provided on said carrier as one body.

11. The system according to claim 8, wherein said carrier propelling means includes a three-phase AC power source for providing three-phase AC power and said stator units have three-phase coils and are connected to said three-phase AC power source.

12. The system according to claim 1, which further comprises carrier propelling means including a plurality of stator units disposed along said at least one rail and facing said magnet units, said carrier being given a propelling power by electromagnetic forces acting between the magnetic flux of said magnet units and magnetic flux of said stator units.

13. The system according to claim 12, wherein said stator units are disposed beneath said at least one rail.

14. The system according to claim 12, comprising two rails wherein said stator units are disposed on the outer sides of said rails.

15. The system according to claim 12, comprising two rails wherein said stator units are disposed within the inner sides of said rails.

16. The system according to claim 1, wherein said stopping unit includes a yoke and a coil wound thereon.

17. The system according to claim 1, wherein said stopping unit includes a permanent magnet.

18. The system according to claim 1, wherein said stopping unit includes a permanent magnet and a yoke provided thereon.

19. The system according to claim 1, wherein said stopping unit includes a yoke made of a ferromagnetic material.

* * * * *